(12) United States Patent
Chen et al.

(10) Patent No.: US 11,302,807 B2
(45) Date of Patent: Apr. 12, 2022

(54) HIGH ELECTRON MOBILITY TRANSISTOR (HEMT) DEVICE HAVING A METAL NITRIDE LAYER DISPOSED BETWEEN GATE CONTACT AND A CAPPING LAYER AND A METHOD FOR FORMING THE SAME

(71) Applicant: Nuvoton Technology Corporation, Hsinchu (TW)

(72) Inventors: Chih-Hao Chen, Hsinchu (TW); Wen-Ying Wen, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 16/406,037

(22) Filed: May 8, 2019

(65) Prior Publication Data
US 2020/0111901 A1    Apr. 9, 2020

(30) Foreign Application Priority Data

Oct. 4, 2018   (TW) ................................ 107135006

(51) Int. Cl.
*H01L 29/778*       (2006.01)
*H01L 21/3205*      (2006.01)
(Continued)

(52) U.S. Cl.
CPC .... *H01L 29/7786* (2013.01); *H01L 21/32051* (2013.01); *H01L 29/2003* (2013.01);
(Continued)

(58) Field of Classification Search
CPC ........... H01L 21/32051; H01L 29/2003; H01L 29/4966; H01L 29/66462; H01L 29/778; H01L 29/7786
See application file for complete search history.

(56) References Cited

U.S. PATENT DOCUMENTS

2003/0020092 A1    1/2003  Parikh et al.
2003/0157776 A1    8/2003  Smith
(Continued)

FOREIGN PATENT DOCUMENTS

TW         200605350         2/2006

OTHER PUBLICATIONS

"Office Action of Taiwan Counterpart Application", dated May 22, 2019, pp. 1-5.
(Continued)

*Primary Examiner* — Anh D Mai
(74) *Attorney, Agent, or Firm* — JCIPRNET

(57) ABSTRACT

A high electron mobility transistor (HEMT) device including a substrate, a first channel layer, a second channel layer, a cap layer, a first metal nitride layer, a gate, a source, and a drain is provided. The first channel layer is disposed on the substrate. The second channel layer is disposed on the first channel layer. The cap layer is disposed on the second channel layer and exposes a portion of the second channel layer. The first metal nitride layer is disposed on the cap layer. The gate is disposed on the first metal nitride layer. The width of the first metal nitride layer is greater than or equal to the width of the gate. The source and the drain are disposed on the second channel layer at two sides of the gate.

11 Claims, 6 Drawing Sheets

(51) Int. Cl.
*H01L 29/20* (2006.01)
*H01L 29/417* (2006.01)
*H01L 29/66* (2006.01)
*H01L 29/49* (2006.01)

(52) U.S. Cl.
CPC .... *H01L 29/41725* (2013.01); *H01L 29/4966* (2013.01); *H01L 29/66462* (2013.01)

(56) References Cited

U.S. PATENT DOCUMENTS

| | | | |
|---|---|---|---|
| 2007/0018199 A1* | 1/2007 | Sheppard | H01L 29/66431 257/200 |
| 2007/0161128 A1* | 7/2007 | Ueno | H01L 21/28556 438/5 |
| 2008/0185613 A1* | 8/2008 | Beach | H01L 29/205 257/192 |
| 2011/0272742 A1* | 11/2011 | Akiyama | H01L 29/66431 257/194 |
| 2012/0112202 A1* | 5/2012 | Hwang | H01L 29/66462 257/76 |
| 2014/0264367 A1* | 9/2014 | Banerjee | H01L 29/66462 257/76 |
| 2014/0264454 A1 | 9/2014 | Banerjee et al. | |

OTHER PUBLICATIONS

"Office Action of Taiwan Counterpart Application", dated Jan. 15, 2020, p. 1-p. 6.

* cited by examiner

US 11,302,807 B2

HIGH ELECTRON MOBILITY TRANSISTOR (HEMT) DEVICE HAVING A METAL NITRIDE LAYER DISPOSED BETWEEN GATE CONTACT AND A CAPPING LAYER AND A METHOD FOR FORMING THE SAME

CROSS-REFERENCE TO RELATED APPLICATION

This application claims the priority benefit of Taiwan application serial no. 107135006, filed on Oct. 4, 2018. The entirety of the above-mentioned patent application is hereby incorporated by reference herein and made a part of this specification.

BACKGROUND OF THE INVENTION

Field of the Invention

The invention relates to a semiconductor device and a manufacturing method thereof and particularly relates to a high electron mobility transistor (HEMT) device and a manufacturing method thereof.

Description of Related Art

In the current process of the Group III-V HEMT device, some high-temperature processes are performed to complete the manufacture of the HEMT device. However, the high-temperature processes cause metal particles in the layer below the gate to diffuse into the cap layer located between the channel layer and the gate, and even into the gate. This thermal variation causes the gate to be abnormal. As a result, the reliability of the HEMT device is reduced.

SUMMARY OF THE INVENTION

The invention provides an HEMT device and a manufacturing method thereof that may have better thermal stability and reliability.

The invention provides an HEMT device including a substrate, a first channel layer, a second channel layer, a cap layer, a first metal nitride layer, a gate, a source, and a drain. The first channel layer is disposed on the substrate. The second channel layer is disposed on the first channel layer. The cap layer is disposed on the second channel layer and exposes a portion of the second channel layer. The first metal nitride layer is disposed on the cap layer. The gate is disposed on the first metal nitride layer. The width of the first metal nitride layer is greater than or equal to the width of the gate. The source and the drain are disposed on the second channel layer at two sides of the gate.

According to an embodiment of the invention, the HEMT device may further include a second metal nitride layer and a third metal nitride layer. The second metal nitride layer is disposed between the source and the second channel layer. The third metal nitride layer is disposed between the drain and the second channel layer.

According to an embodiment of the invention, in the HEMT device, the thicknesses of the first metal nitride layer, the second metal nitride layer, and the third metal nitride layer are, for example, 70 Å to 150 Å, respectively.

According to an embodiment of the invention, in the HEMT device, the material of the cap layer is, for example, undoped gallium nitride or P-type doped gallium nitride.

According to an embodiment of the invention, the HEMT device may further include a buffer layer. The buffer layer is disposed between the first channel layer and the substrate.

According to an embodiment of the invention, the HEMT device may further include a passivation layer. The passivation layer is disposed on the cap layer and exposes a portion of the cap layer. The first metal nitride layer may be disposed on the cap layer exposed by the passivation layer.

According to an embodiment of the invention, the HEMT device may further include an insulating layer. The insulating layer is disposed between the gate and the first metal nitride layer.

The invention provides a manufacturing method of an HEMT device including the following steps. A first channel layer is formed on a substrate. A second channel layer is formed on the first channel layer. A cap layer is formed on the second channel layer. The cap layer exposes a portion of the second channel layer. A first metal nitride layer is formed on the cap layer. A gate is formed on the first metal nitride layer. The width of the first metal nitride layer is greater than or equal to the width of the gate. A source and a drain are formed on the second channel layer at two sides of the gate.

According to an embodiment of the invention, the manufacturing method of the HEMT device may further include the following steps. A second metal nitride layer is formed between the source and the second channel layer. A third metal nitride layer is formed between the drain and the second channel layer.

According to an embodiment of the invention, in the manufacturing method of the HEMT device, the forming method of the first metal nitride layer, the second metal nitride layer, and the third metal nitride layer may include the following steps. A metal nitride material layer covering the cap layer and the second channel layer is formed. After the gate, the source, and the drain are formed, a patterning process is performed on the metal nitride material layer.

According to an embodiment of the invention, in the manufacturing method of the HEMT device, the forming method of the metal nitride material layer is, for example, a physical vapor deposition method.

According to an embodiment of the invention, in the manufacturing method of the HEMT device, the second metal nitride layer and the second channel layer may form a covalent bonding, and the third metal nitride layer and the second channel layer may form a covalent bonding. The forming method of the covalent bonding is, for example, performing an annealing process at 600° C. or less or performing a direct generation at room temperature.

According to an embodiment of the invention, the manufacturing method of the HEMT device may further include forming a buffer layer on the substrate before the first channel layer is formed.

According to an embodiment of the invention, the manufacturing method of the HEMT device may further include forming a passivation layer on the cap layer. The passivation layer exposes a portion of the cap layer. The first metal nitride layer may be formed on the cap layer exposed by the passivation layer.

According to an embodiment of the invention, the manufacturing method of the HEMT device may further include forming an insulating layer between the gate and the first metal nitride layer.

Based on the above, in the HEMT device and the manufacturing method thereof provided in the invention, since the first metal nitride layer is located below the gate, the first metal nitride layer can block metal particles in the layer below the gate from diffusing into the gate during the process, thereby preventing degradation of the gate due to heat. As a result, the thermal stability and reliability of the HEMT device can be improved.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A to FIG. 1G are cross-sectional views of a manufacturing process of an HEMT device of an embodiment of the invention. The HEMT device may be a depletion-mode (D-mode) HEMT device, a D-mode metal-insulator-semiconductor (MIS) HEMT device, or an enhancement-mode (E-mode) HEMT device. In the present embodiment, the HEMT device is exemplified by the D-mode HEMT, but the invention is not limited thereto.

Figure 1A:
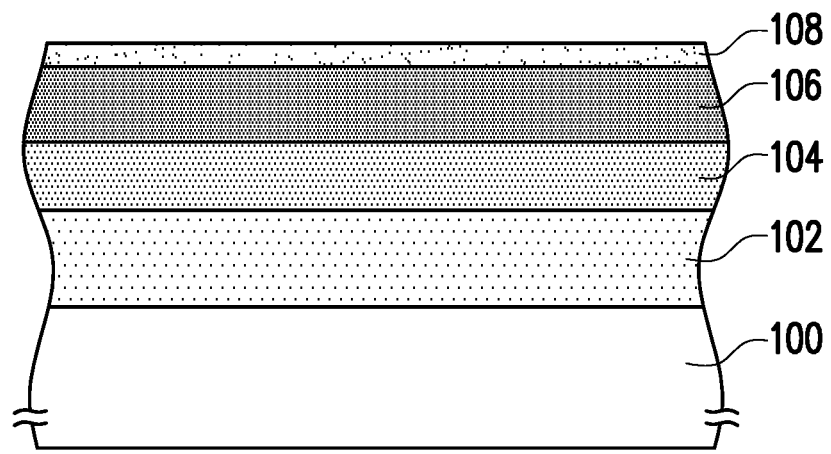
FIG. 1A to FIG. 1G are cross-sectional views of a manufacturing process of an HEMT device of an embodiment of the invention.

Referring to FIG. 1A, a buffer layer 102 may be formed on a substrate 100. The material of the substrate 100 is, for example, sapphire, Si, SiC, or GaN. The material of the buffer layer 102 is, for example, gallium nitride (GaN) or aluminum gallium nitride (AlGaN). The buffer layer 102 may be formed by an epitaxial growth method, such as metal-organic chemical vapor deposition (MOCVD). In an embodiment, a nucleation layer (not shown) may be formed between the buffer layer 102 and the substrate 100.

A channel layer 104 is formed on the buffer layer 102. The material of the channel layer 104 is, for example, gallium nitride (GaN). The channel layer 104 may be formed by an epitaxial growth method, such as MOCVD.

A channel layer 106 is formed on the channel layer 104. The material of the channel layer 106 is, for example, aluminum gallium nitride (AlGaN). The channel layer 106 may be formed by an epitaxial growth method, such as MOCVD.

A cap material layer 108 is formed on the channel layer 106. In the present embodiment, the material of the cap material layer 108 is, for example, undoped gallium nitride (GaN), but the invention is not limited thereto. The cap material layer 108 may be formed by an epitaxial growth method, such as MOCVD.

Figure 1B:
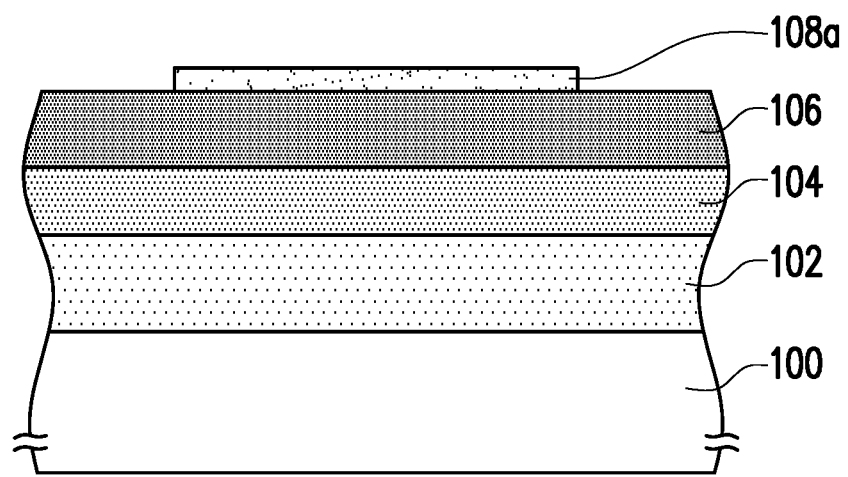

Referring to FIG. 1B, the cap material layer 108 may be patterned to form a cap layer 108a on the channel layer 106. The cap layer 108a exposes a portion of the channel layer 106. For example, the cap material layer 108 may be patterned by a lithography process and an etching process.

Figure 1C:
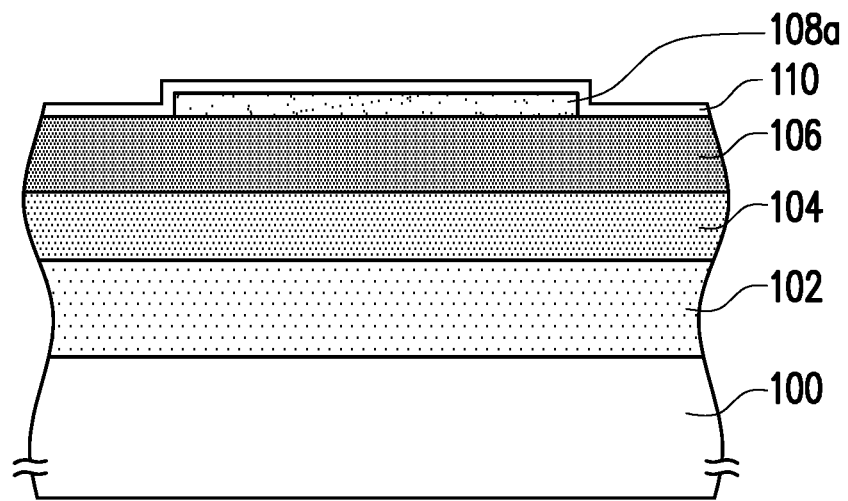

Referring to FIG. 1C, a passivation material layer 110 covering the cap layer 108a and the channel layer 106 may be formed. The material of the passivation material layer 110 is, for example, silicon oxide or silicon nitride. The forming method of the passivation material layer 110 is, for example, a chemical vapor deposition method.

Figure 1D:
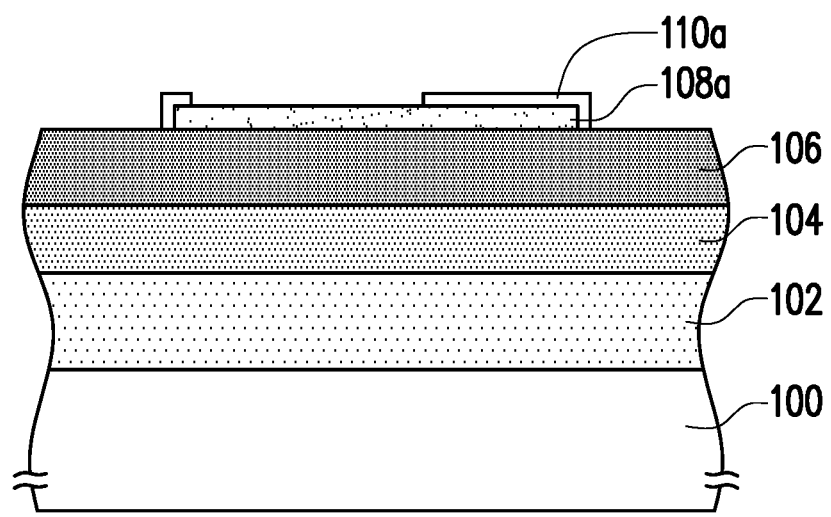

Referring to FIG. 1D, the passivation material layer 110 may be patterned to form a passivation layer 110a on the cap layer 108a. The passivation layer 110a exposes a portion of the cap layer 108a. For example, the passivation material layer 110 may be patterned by a lithography process and an etching process.

Figure 1E:
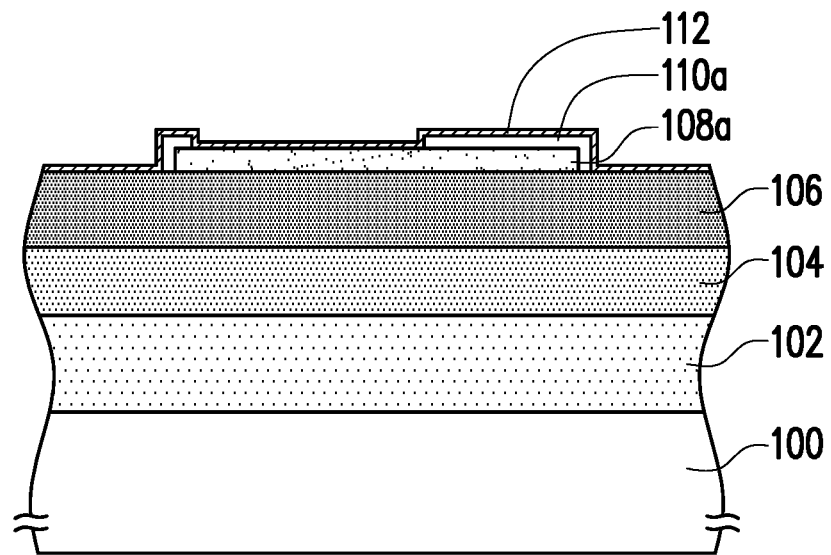

Referring to FIG. 1E, a metal nitride material layer 112 covering the cap layer 108a and the channel layer 106 is formed. In addition, the metal nitride material layer 112 may further cover the passivation layer 110a. The material of the metal nitride material layer 112 is, for example, titanium nitride (TiN). The thickness of the metal nitride material layer 112 is, for example, 70 Å to 150 Å. The forming method of the metal nitride material layer 112 is, for example, a physical vapor deposition method.

Figure 1F:
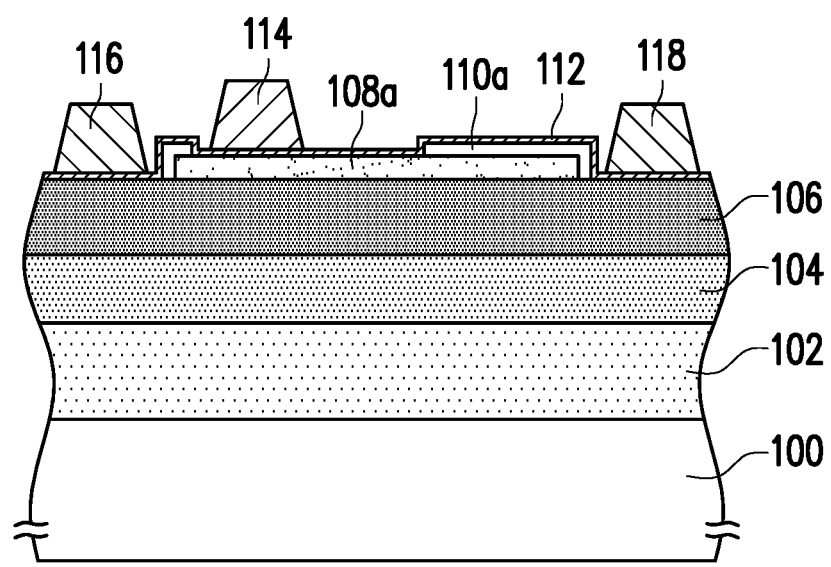

Referring to FIG. 1F, a gate 114 is formed on the metal nitride material layer 112. The material of the gate 114 is, for example, nickel (Ni) or gold (Au). For example, the forming method of the gate 114 may be a combination of a deposition process, a lithography process, and an etching process.

A source 116 and a drain 118 are formed on the metal nitride material layer 112 above the channel layer 106 at two sides of the gate 114. Moreover, the source 116 and the drain 118 may be formed above the channel layer 106 exposed by the cap layer 108a. The material of the source 116 and the drain 118 is, for example, aluminum (Al). For example, the forming method of the source 116 and the gate 118 may be a combination of a deposition process, a lithography process, and an etching process.

Moreover, those having ordinary skill in the art may adjust the forming order of the gate 114, the source 116, and the drain 118 according to process requirements. For example, the gate 114 may be formed first, and then the source 116 and the drain 118 are formed. In another embodiment, the source 116 and the drain 118 may be formed first, and then the gate 114 is formed.

Figure 1G:
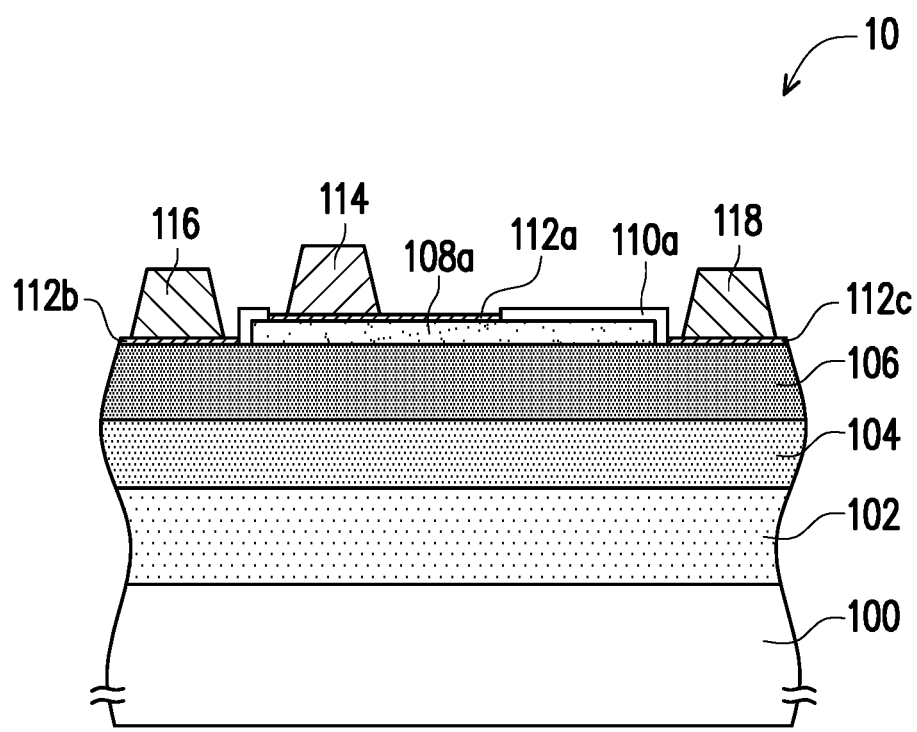

Referring to FIG. 1G, after the gate 114, the source 116, and the drain 118 are formed, the metal nitride material layer 112 is patterned, whereby a metal nitride layer 112a may be formed on the cap layer 108a, a metal nitride layer 112b may be formed between the source 116 and the channel layer 106, and a metal nitride layer 112c may be formed between the drain 118 and the channel layer 106. The metal nitride layer 112a, the metal nitride layer 112b, and the metal nitride layer 112c may be not connected to one another. For example, the metal nitride material layer 112 may be patterned by a lithography process and an etching process.

Moreover, the gate 114 is located on the metal nitride layer 112a. The metal nitride layer 112a may be formed on the cap layer 108a exposed by the passivation layer 110a. In an embodiment, as long as the metal nitride layer 112a, the metal nitride layer 112b, and the metal nitride layer 112c are not connected to one another, the metal nitride layer 112a may be extended onto a portion of the passivation layer 110a (refer to FIG. 2C).

The metal nitride layer 112a can block metal particles in the layer below the gate 114 from diffusing into the gate 114, thereby preventing degradation of the gate 114 due to heat. Moreover, the width of the metal nitride layer 112a may be greater than or equal to the width of the gate 114, and therefore the gate 114 and the metal nitride layer 112a can have a gradual field effect, such that the electric field distribution below the gate of the channel can be expanded evenly, and therefore breakdown voltage and device stability can be improved.

The metal nitride layer 112b and the channel layer 106 may form the covalent bonding, and the metal nitride layer 112c and the channel layer 106 may form the covalent bonding. The forming method of the covalent bonding is, for example, performing an annealing process at 600° C. or less or performing a direct generation at room temperature. For example, the annealing process described above may be performed after the metal nitride material layer 112 is formed. Therefore, in the present embodiment, the covalent bonding may be directly generated at a low temperature or even at normal temperature, such that metal particles in the layer below the cap layer 108a can be prevented from diffusing into the cap layer 108a. As a result, the cap layer 108a can be prevented from losing the original function thereof due to variation from heat.

Hereinafter, the HEMT device 10 of the present embodiment is described with reference to FIG. 1G.

Referring to FIG. 1G, the HEMT device 10 includes a substrate 100, a channel layer 104, a channel layer 106, a cap layer 108a, a metal nitride layer 112a, a gate 114, a source 116, and a drain 118, and may further include at least one of a buffer layer 102, a passivation layer 110a, a metal nitride layer 112b, and a metal nitride layer 112c. The channel layer 104 is disposed on the substrate 100. The channel layer 106 is disposed on the channel layer 104. The cap layer 108a is disposed on the channel layer 106 and exposes a portion of the channel layer 106. The material of the cap layer 108a is, for example, undoped gallium nitride (GaN), but the invention is not limited thereto. The metal nitride layer 112a is disposed on the cap layer 108a. The gate 114 is disposed on the metal nitride layer 112a. The source 116 and the drain 118 are disposed on the channel layer 106 at two sides of the gate 114. In the present embodiment, the source 116 and the drain 118 may be disposed on the channel layer 106 exposed by the cap layer 108a. The buffer layer 102 is disposed between the channel layer 104 and the substrate 100. The passivation layer 110a is disposed on the cap layer 108a and exposes a portion of the cap layer 108a. The metal nitride layer 112a may be disposed on the cap layer 108a exposed by the passivation layer 110a. The metal nitride layer 112b is disposed between the source 116 and the channel layer 106. The metal nitride layer 112c is disposed between the drain 118 and the channel layer 106. The material of the metal nitride layer 112a, the metal nitride layer 112b, and the metal nitride layer 112c is, for example, titanium nitride (TiN). The thicknesses of the metal nitride layer 112a, the metal nitride layer 112b, and the metal nitride layer 112c are, for example, respectively 70 Å to 150 Å. Moreover, the material, arrangement, forming method, and efficacy of each member in the HEMT device 10 are described in detail in the above embodiments and therefore are not repeated herein.

Based on the above embodiments, since the metal nitride layer 112a is located below the gate 114, the metal nitride layer 112a can block metal particles in the layer below the gate 114 from diffusing into the gate 114 during the process, thereby preventing degradation of the gate 114 due to heat. As a result, the thermal stability and reliability of the HEMT device 10 can be improved.

Figure 2A:
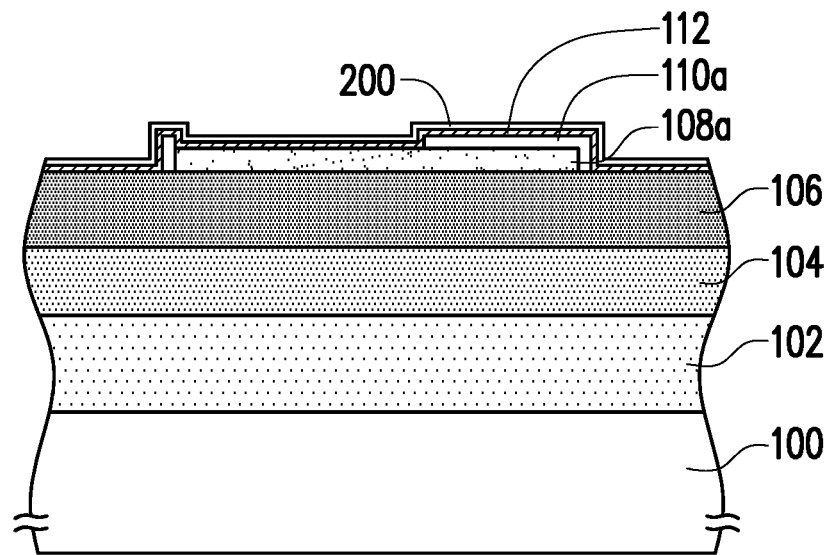
FIG. 2A to FIG. 2C are cross-sectional views of a manufacturing process of an HEMT device of another embodiment of the invention.
Figure 2B:
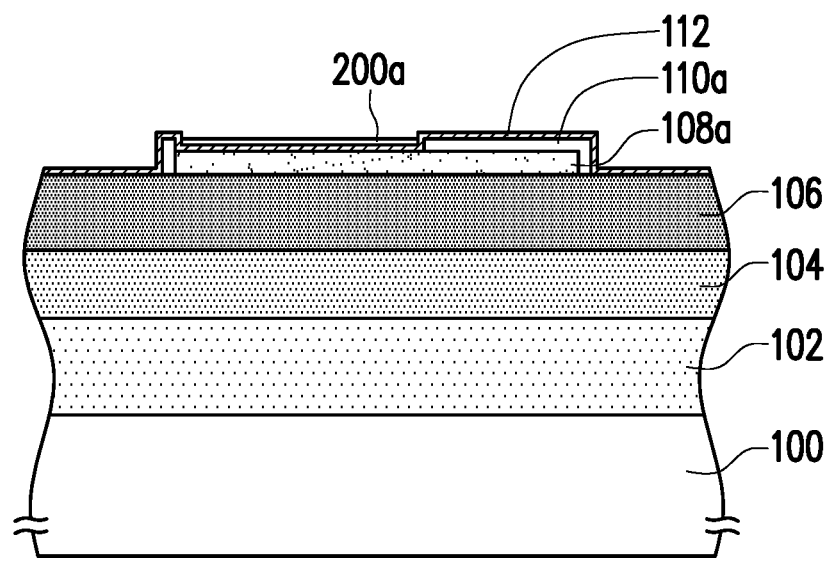
Figure 2C:
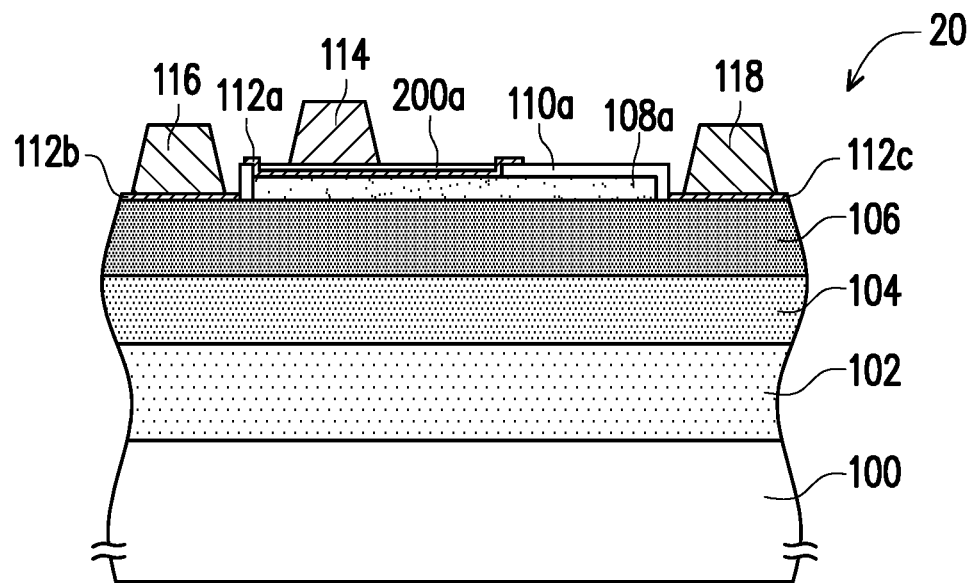

FIG. 2A to FIG. 2C are cross-sectional views of a manufacturing process of an HEMT device of another embodiment of the invention. FIG. 2A to FIG. 2C are cross-sectional views of the manufacturing process subsequent to the step of FIG. 1E. Moreover, the region of the cap layer 108a exposed by the passivation layer 110a in FIG. 2A may be slightly different than that of the passivation layer 110a in FIG. 1E. Those having ordinary skill in the art may adjust the region of the cap layer 108a exposed by the passivation layer 110a according to the functional requirements of the device.

Referring to FIG. 1E to FIG. 1G and FIG. 2A to FIG. 2C, the differences between an HEMT device 20 of FIG. 2C and the HEMT device 10 of FIG. 1G in manufacturing method are as follows. Referring to FIG. 2A to FIG. 2C, in the manufacturing method of the HEMT device 20, an insulating layer 200a is formed between the gate 114 and the metal nitride layer 112a. The material of the insulating layer 200a is, for example, silicon oxide or silicon nitride.

For example, the forming method of the insulating layer 200a may include the following steps. Referring to FIG. 2A, an insulating material layer 200 covering the metal nitride material layer 112 may be formed. The forming method of the insulating material layer 200 is, for example, a chemical vapor deposition method. Referring to FIG. 2B, the insulating material layer 200 may be patterned to form an insulating layer 200a on the metal nitride material layer 112. For example, the insulating material layer 200 may be patterned by a lithography process and an etching process.

Moreover, other steps in the manufacturing method of the HEMT device 20 may be referred to the manufacturing method of the HEMT device 10 and are not repeated herein.

Furthermore, the differences in structure between the HEMT device 20 of FIG. 2C and the HEMT device 10 of FIG. 1G are as follows. The HEMT device 20 of FIG. 2C may be the D-mode MIS HEMT device. The HEMT device 20 may further include an insulating layer 200a. The insulating layer 200a is disposed between the gate 114 and the metal nitride layer 112a. Moreover, the same members in the HEMT device 20 and the HEMT device 10 are represented by the same reference numerals and descriptions thereof are omitted.

Based on the above embodiments, in the HEMT device 20 and the manufacturing method thereof, since the metal nitride layer 112a is located below the gate 114, the metal nitride layer 112a can block metal particles in the layer below the gate 114 from diffusing into the gate 114 during the process, thereby preventing degradation of the gate 114 due to heat. As a result, the thermal stability and reliability of the HEMT device 20 can be improved.

Figure 3:
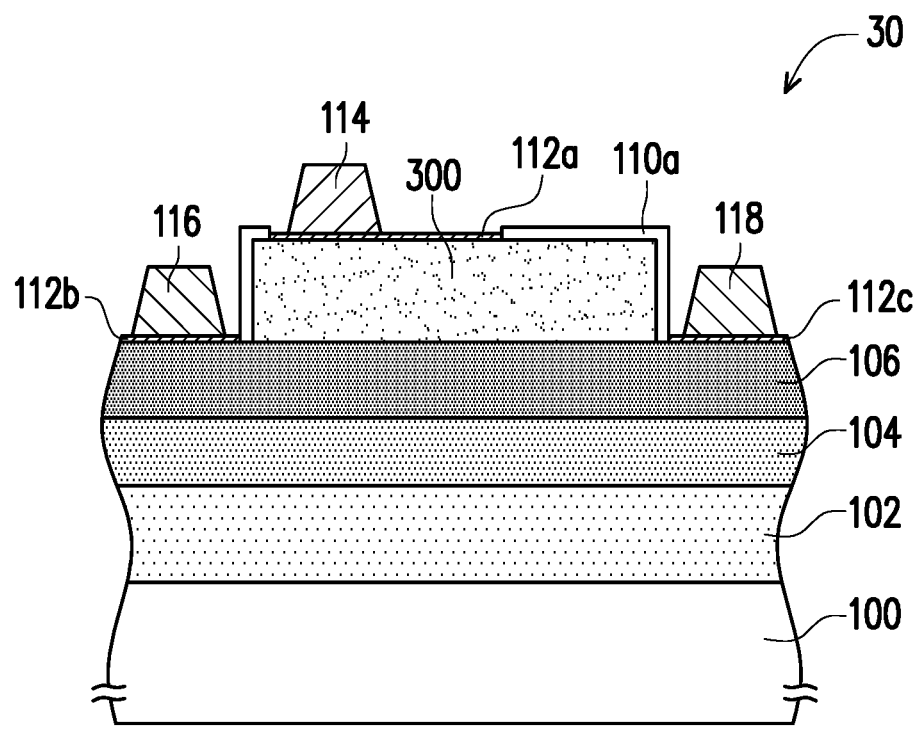
FIG. 3 is a cross-sectional view of an HEMT device of another embodiment of the invention.

FIG. 3 is a cross-sectional view of an HEMT device of another embodiment of the invention. The region of the cap layer 108a exposed by the passivation layer 110a in FIG. 3 may be slightly different than that of the passivation layer 110a in FIG. 1G. Those having ordinary skill in the art may adjust the region of the cap layer 108a exposed by the passivation layer 110a according to process requirements.

Referring to FIG. 1G and FIG. 3, the differences between an HEMT device 30 of FIG. 3 and the HEMT device 10 of FIG. 1G in structure and manufacturing method are as follows. Referring to FIG. 3, the HEMT device 30 of FIG. 3 may be the E-mode HEMT device. The material of the cap layer 300 may be P-type doped gallium nitride (P—GaN) such as magnesium-doped gallium nitride. Moreover, the material of the gate 114 may be molybdenum (Mo), tungsten (W), or aluminum (Al), and the material of the source 116 and the drain 118 may be aluminum (Al). In the manufacturing method of the HEMT device 30, the gate 114, the source 116, and the drain 118 may be sequentially formed. In addition, in the case that the materials of the gate 114, the source 116, and the drain 118 are the same, the gate 114, the source 116, and the drain 118 may be formed simultaneously by the same process.

Based on the above embodiments, in the HEMT device 30 and the manufacturing method thereof, since the metal nitride layer 112a is located below the gate 114, the metal nitride layer 112a can block metal particles in the layer below the gate 114 from diffusing into the gate 114 during the process, thereby preventing degradation of the gate 114 due to heat. As a result, the thermal stability and reliability of the HEMT device 30 can be improved.

Based on the above, in the HEMT device and the manufacturing method thereof according to the above embodiments, the metal nitride layer located below the gate can prevent metal particles from diffusing into the gate, thereby preventing the degradation of the gate due to heat. Therefore, the thermal stability and reliability of the HEMT device can be improved.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A high electron mobility transistor device, comprising:
    a substrate;
    a first channel layer disposed on the substrate;
    a second channel layer disposed on the first channel layer;
    a cap layer disposed on the second channel layer;
    a first metal nitride layer disposed on the cap layer;
    a gate disposed on the first metal nitride layer, wherein a width of the first metal nitride layer is greater than or equal to a width of the gate;
    an insulating layer disposed between the gate and the first metal nitride layer, wherein the insulating layer completely isolates the gate from the first metal nitride layer, and the first metal nitride layer completely isolates the cap layer from the insulating layer;
    a source and a drain disposed on the second channel layer at two sides of the gate;
    a second metal nitride layer disposed between the source and the second channel layer; and
    a third metal nitride layer disposed between the drain and the second channel layer, wherein
    the first metal nitride layer, the second metal nitride layer, and the third metal nitride layer are derived from the same material layer.

2. The high electron mobility transistor device of claim 1, wherein thicknesses of the first metal nitride layer, the second metal nitride layer, and the third metal nitride layer are respectively 70 Å to 150 Å.

3. The high electron mobility transistor device of claim 1, wherein a material of the cap layer comprises undoped gallium nitride or P-type doped gallium nitride.

4. The high electron mobility transistor device of claim 1, further comprising:
    a buffer layer disposed between the first channel layer and the substrate.

5. The high electron mobility transistor device of claim 1, further comprising:
    a passivation layer disposed on the cap layer.

6. A manufacturing method of a high electron mobility transistor device, comprising:
    forming a first channel layer on a substrate;
    forming a second channel layer on the first channel layer;
    forming a cap layer on the second channel layer, wherein the cap layer exposes a portion of the second channel layer;
    forming a first metal nitride layer on the cap layer;
    forming a gate on the first metal nitride layer, wherein a width of the first metal nitride layer is greater than or equal to a width of the gate;
    forming an insulating layer between the gate and the first metal nitride layer, wherein the insulating layer completely isolates the gate from the first metal nitride layer, and the first metal nitride layer completely isolates the cap layer from the insulating layer;
    forming a source and a drain on the second channel layer at two sides of the gate;
    forming a second metal nitride layer between the source and the second channel layer; and
    forming a third metal nitride layer between the drain and the second channel layer, wherein
    the first metal nitride layer, the second metal nitride layer, and the third metal nitride layer are simultaneously formed by the same process.

7. The manufacturing method of the high electron mobility transistor device of claim 6, wherein a forming method of the first metal nitride layer, the second metal nitride layer, and the third metal nitride layer comprises:
    forming a metal nitride material layer covering the cap layer and the second channel layer; and
    performing a patterning process on the metal nitride material layer after the gate, the source, and the drain are formed.

8. The manufacturing method of the high electron mobility transistor device of claim 7, wherein a forming method of the metal nitride material layer comprises a physical vapor deposition method.

9. The manufacturing method of the high electron mobility transistor device of claim 6, wherein the second metal nitride layer and the second channel layer form a covalent bonding, the third metal nitride layer and the second channel layer form the covalent bonding, and a forming method of the covalent bonding comprises performing an annealing process of 600° C. or less.

10. The manufacturing method of the high electron mobility transistor device of claim 6, further comprising:
    forming a buffer layer on the substrate before the first channel layer is formed.

11. The manufacturing method of the high electron mobility transistor device of claim 6, further comprising:
    forming a passivation layer on the cap layer, wherein the passivation layer exposes a portion of the cap layer, and the first metal nitride layer is formed on the cap layer exposed by the passivation layer.

* * * * *